(12) United States Patent
Flores et al.

(10) Patent No.: US 8,655,637 B2
(45) Date of Patent: Feb. 18, 2014

(54) ADDRESS RANGE COMPARATOR FOR DETECTION OF MULTI-SIZE MEMORY ACCESSES WITH DATA MATCHING QUALIFICATION AND FULL OR PARTIAL OVERLAP

(75) Inventors: Jose L. Flores, Richardson, TX (US);
Lewis Nardini, Dallas, TX (US); Maria B. H. Gill, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1506 days.

(21) Appl. No.: 11/566,772

(22) Filed: Dec. 5, 2006

(65) Prior Publication Data
US 2007/0094537 A1 Apr. 26, 2007

Related U.S. Application Data

(62) Division of application No. 10/301,887, filed on Nov. 22, 2002, now Pat. No. 7,165,018.

(51) Int. Cl.
*G06F 9/455* (2006.01)

(52) U.S. Cl.
USPC .................. 703/23; 714/30; 714/53

(58) Field of Classification Search
USPC ......................... 703/23; 714/53, 30
See application file for complete search history.

(56) References Cited

U.S. PATENT DOCUMENTS

| 5,448,705 | A |   | 9/1995  | Nguyen et al. |         |
|-----------|---|---|---------|---------------|---------|
| 5,577,219 | A |   | 11/1996 | Timko et al.  |         |
| 5,657,475 | A |   | 8/1997  | Gillespie et al. |      |
| 5,850,632 | A | * | 12/1998 | Robertson     | 711/170 |
| 5,970,246 | A |   | 10/1999 | Moughani et al. |       |
| 7,117,398 | B2| * | 10/2006 | Flores et al. | 714/53  |
| 7,165,018 | B2| * | 1/2007  | Flores et al. | 703/23  |
| 2006/0282706 | A1| * | 12/2006 | Flores et al. | 714/30  |

FOREIGN PATENT DOCUMENTS

| EP | 1 041 489 A | 10/2000 |
|----|-------------|---------|
| JP | 09 054706 A | 2/1997  |

* cited by examiner

*Primary Examiner* — Saif Alhija
(74) *Attorney, Agent, or Firm* — Robert D. Marshall, Jr.; W. James Brady; Frederick J. Telecky, Jr.

(57) ABSTRACT

An memory access address comparator includes two comparators comparing an input memory access address with respective reference addresses. The comparators produce a match indication on selectable criteria, such as address size, full or partial overlap, greater than, less than, equal to, not equal to, less than or equal to, and greater than or equal to, and can be selectively chained. Input multiplexers permit memory access address bus selection. The comparator output may be selectively dependent upon corresponding data matches. The reference addresses, comparison data and control functions are enabled via central processing unit accessible memory mapped registers.

20 Claims, 4 Drawing Sheets

ADDRESS RANGE COMPARATOR FOR DETECTION OF MULTI-SIZE MEMORY ACCESSES WITH DATA MATCHING QUALIFICATION AND FULL OR PARTIAL OVERLAP

This application is a divisional application of U.S. patent application Ser. No. 10/301,887 filed Nov. 22, 2002 now U.S. Pat. No. 7,165,018.

TECHNICAL FIELD OF THE INVENTION

The technical field of this invention is emulation hardware particularly for highly integrated digital signal processing systems.

BACKGROUND OF THE INVENTION

Advanced wafer lithography and surface-mount packaging technology are integrating increasingly complex functions at both the silicon and printed circuit board level of electronic design. Diminished physical access to circuits for test and emulation is an unfortunate consequence of denser designs and shrinking interconnect pitch. Designed-in testability is needed so the finished product is both controllable and observable during test and debug. Any manufacturing defect is preferably detectable during final test before a product is shipped. This basic necessity is difficult to achieve for complex designs without taking testability into account in the logic design phase so automatic test equipment can test the product.

In addition to testing for functionality and for manufacturing defects, application software development requires a similar level of simulation, observability and controllability in the system or sub-system design phase. The emulation phase of design should ensure that a system of one or more ICs (integrated circuits) functions correctly in the end equipment or application when linked with the system software. With the increasing use of ICs in the automotive industry, telecommunications, defense systems, and life support systems, thorough testing and extensive real-time debug becomes a critical need.

Functional testing, where the designer generates test vectors to ensure conformance to specification, still remains a widely used test methodology. For very large systems this method proves inadequate in providing a high level of detectable fault coverage. Automatically generated test patterns are desirable for full testability, and controllability and observability. These are key goals that span the full hierarchy of test from the system level to the transistor level.

Another problem in large designs is the long time and substantial expense involved in design for test. It would be desirable to have testability circuitry, system and methods that are consistent with a concept of design-for-reusability. In this way, subsequent devices and systems can have a low marginal design cost for testability, simulation and emulation by reusing the testability, simulation and emulation circuitry, systems and methods that are implemented in an initial device. Without a proactive testability, simulation and emulation plan, a large amount of subsequent design time would be expended on test pattern creation and upgrading.

Even if a significant investment were made to design a module to be reusable and to fully create and grade its test patterns, subsequent use of a module may bury it in application specific logic. This would make its access difficult or impossible. Consequently, it is desirable to avoid this pitfall.

The advances of IC design are accompanied by decreased internal visibility and control, reduced fault coverage and reduced ability to toggle states, more test development and verification problems, increased complexity of design simulation and continually increasing cost of CAD (computer aided design) tools. In the board design the side effects include decreased register visibility and control, complicated debug and simulation in design verification, loss of conventional emulation due to loss of physical access by packaging many circuits in one package, increased routing complexity on the board, increased costs of design tools, mixed-mode packaging, and design for produceability. In application development, some side effects are decreased visibility of states, high speed emulation difficulties, scaled time simulation, increased debugging complexity, and increased costs of emulators. Production side effects involve decreased visibility and control, complications in test vectors and models, increased test complexity, mixed-mode packaging, continually increasing costs of automatic test equipment and tighter tolerances.

Emulation technology utilizing scan based emulation and multiprocessing debug was introduced more than 10 years ago. In 1988, the change from conventional in circuit emulation to scan based emulation was motivated by design cycle time pressures and newly available space for on-chip emulation. Design cycle time pressure was created by three factors. Higher integration levels, such as increased use of on-chip memory, demand more design time. Increasing clock rates mean that emulation support logic causes increased electrical intrusiveness. More sophisticated packaging causes emulator connectivity issues. Today these same factors, with new twists, are challenging the ability of a scan based emulator to deliver the system debug facilities needed by today's complex, higher clock rate, highly integrated designs. The resulting systems are smaller, faster, and cheaper. They have higher performance and footprints that are increasingly dense. Each of these positive system trends adversely affects the observation of system activity, the key enabler for rapid system development. The effect is called "vanishing visibility."

Figure 1:
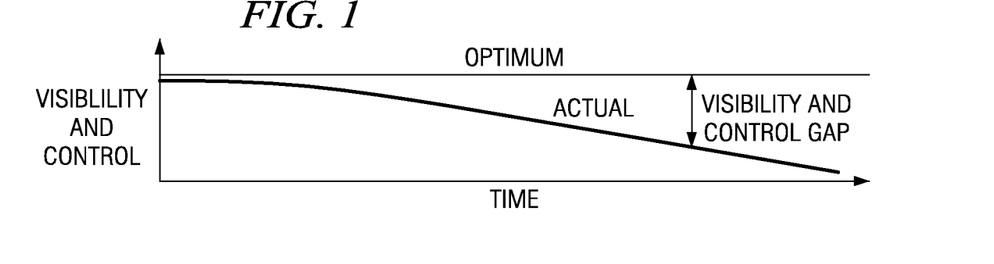
FIG. 1 illustrates the visibility and control of typical integrated circuits as a function of time due to increasing system integration.

FIG. 1 illustrates the trend in visibility and control over time and greater system integration. Application developers prefer the optimum visibility level illustrated in FIG. 1. This optimum visibility level provides visibility and control of all relevant system activity. The steady progression of integration levels and increases in clock rates steadily decrease the actual visibility and control available over time. These forces create a visibility and control gap, the difference between the optimum visibility and control level and the actual level available. Over time, this gap will widen. Application development tool vendors are striving to minimize the gap growth rate. Development tools software and associated hardware components must do more with less resources and in different ways. Tackling this ease of use challenge is amplified by these forces.

With today's highly integrated System-On-a-Chip (SOC) technology, the visibility and control gap has widened dramatically over time. Traditional debug options such as logic analyzers and partitioned prototype systems are unable to keep pace with the integration levels and ever increasing clock rates of today's systems. As integration levels increase, system buses connecting numerous subsystem components move on chip, denying traditional logic analyzers access to these buses. With limited or no significant bus visibility, tools like logic analyzers cannot be used to view system activity or provide the trigger mechanisms needed to control the system under development. A loss of control accompanies this loss in visibility, as it is difficult to control things that are not accessible.

To combat this trend, system designers have worked to keep these buses exposed. Thus the system components were built in a way that enabled the construction of prototyping systems with exposed buses. This approach is also under siege from the ever-increasing march of system clock rates. As the central processing unit (CPU) clock rates increase, chip to chip interface speeds are not keeping pace. Developers find that a partitioned system's performance does not keep pace with its integrated counterpart, due to interface wait states added to compensate for lagging chip to chip communication rates. At some point, this performance degradation reaches intolerable levels and the partitioned prototype system is no longer a viable debug option. In the current era production devices must serve as the platform for application development.

Increasing CPU clock rates are also limiting availability of other simple visibility mechanisms. Since the CPU clock rates can exceed the maximum I/O state rates, visibility ports exporting information in native form can no longer keep up with the CPU. On-chip subsystems are also operated at clock rates that are slower than the CPU clock rate. This approach may be used to simplify system design and reduce power consumption. These developments mean simple visibility ports can no longer be counted on to deliver a clear view of CPU activity. As visibility and control diminish, the development tools used to develop the application become less productive. The tools also appear harder to use due to the increasing tool complexity required to maintain visibility and control. The visibility, control, and ease of use issues created by systems-on-a-chip tend to lengthen product development cycles.

Even as the integration trends present developers with a tough debug environment, they also present hope that new approaches to debug problems will emerge. The increased densities and clock rates that create development cycle time pressures also create opportunities to solve them. On-chip, debug facilities are more affordable than ever before. As high speed, high performance chips are increasingly dominated by very large memory structures, the system cost associated with the random logic accompanying the CPU and memory subsystems is dropping as a percentage of total system cost. The incremental cost of several thousand gates is at an all time low. Circuits of this size may in some cases be tucked into a corner of today's chip designs. The incremental cost per pin in today's high density packages has also dropped. This makes it easy to allocate more pins for debug. The combination of affordable gates and pins enables the deployment of new, on-chip emulation facilities needed to address the challenges created by systems-on-a-chip.

When production devices also serve as the application debug platform, they must provide sufficient debug capabilities to support time to market objectives. Since the debugging requirements vary with different applications, it is highly desirable to be able to adjust the on-chip debug facilities to balance time to market and cost needs. Since these on-chip capabilities affect the chip's recurring cost, the scalability of any solution is of primary importance. "Pay only for what you need" should be the guiding principle for on-chip tools deployment. In this new paradigm, the system architect may also specify the on-chip debug facilities along with the remainder of functionality, balancing chip cost constraints and the debug needs of the product development team.

Figure 2:
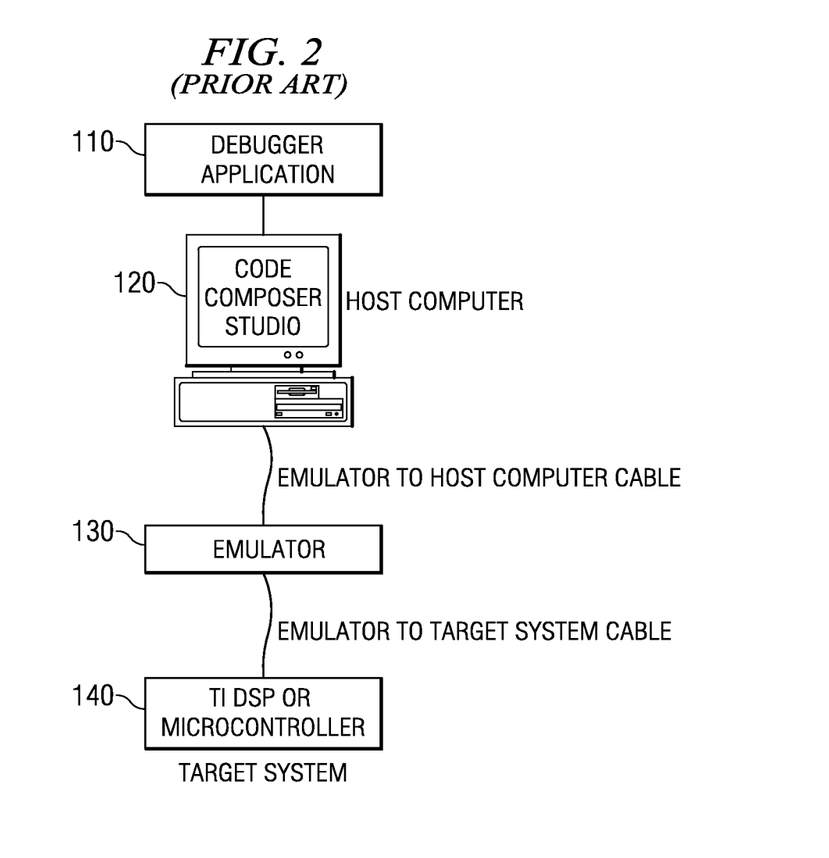
FIG. 2 illustrates an emulation system to which this invention is applicable.

FIG. 2 illustrates an emulator system 100 including four emulator components. These four components are: a debugger application program 110; a host computer 120; an emulation controller 130; and on-chip debug facilities 140. FIG. 2 illustrates the connections of these components. Host computer 120 is connected to an emulation controller 130 external to host 120. Emulation controller 130 is also connected to target system 140. The user preferably controls the target application on target system 140 through debugger application program 110.

Host computer 120 is generally a personal computer. Host computer 120 provides access the debug capabilities through emulator controller 130. Debugger application program 110 presents the debug capabilities in a user-friendly form via host computer 120. The debug resources are allocated by debug application program 110 on an as needed basis, relieving the user of this burden. Source level debug utilizes the debug resources, hiding their complexity from the user. Debugger application program 110 together with the on-chip trace and triggering facilities provide a means to select, record, and display chip activity of interest. Trace displays are automatically correlated to the source code that generated the trace log. The emulator provides both the debug control and trace recording function.

The debug facilities are preferably programmed using standard emulator debug accesses through a JTAG or similar serial debug interface. Since pins are at a premium, the preferred embodiment of the invention provides for the sharing of the debug pin pool by trace, trigger, and other debug functions with a small increment in silicon cost. Fixed pin formats may also be supported. When the pin sharing option is deployed, the debug pin utilization is determined at the beginning of each debug session before target system 140 is directed to run the application program. This maximizes the trace export bandwidth. Trace bandwidth is maximized by allocating the maximum number of pins to trace.

The debug capability and building blocks within a system may vary. Debugger application program 100 therefore establishes the configuration at runtime. This approach requires the hardware blocks to meet a set of constraints dealing with configuration and register organization. Other components provide a hardware search capability designed to locate the blocks and other peripherals in the system memory map. Debugger application program 110 uses a search facility to locate the resources. The address where the modules are located and a type ID uniquely identifies each block found. Once the IDs are found, a design database may be used to ascertain the exact configuration and all system inputs and outputs.

Host computer 120 generally includes at least 64 Mbytes of memory and is capable of running Windows 95, SR-2, Windows NT, or later versions of Windows. Host computer 120 must support one of the communications interfaces required by the emulator. These may include: Ethernet 10T and 100T; TCP/IP protocol; Universal Serial Bus (USB); Firewire IEEE 1394; and parallel port such as SPP, EPP and ECP.

Host computer 120 plays a major role in determining the real-time data exchange bandwidth. First, the host to emulator communication plays a major role in defining the maximum sustained real-time data exchange bandwidth because emulator controller 130 must empty its receive real-time data exchange buffers as fast as they are filled. Secondly, host computer 120 originating or receiving the real-time data exchange data must have sufficient processing capacity or disc bandwidth to sustain the preparation and transmission or processing and storing of the received real-time data exchange data. A state of the art personal computer with a Firewire communication channel (IEEE 1394) is preferred to obtain the highest real-time data exchange bandwidth. This bandwidth can be as much as ten times greater performance than other communication options.

Emulation controller 130 provides a bridge between host computer 120 and target system 140. Emulation controller 130 handles all debug information passed between debugger application program 110 running on host computer 120 and a target application executing on target system 140. A presently preferred minimum emulator configuration supports all of the following capabilities: real-time emulation; real-time data exchange; trace; and advanced analysis.

Emulation controller 130 preferably accesses real-time emulation capabilities such as execution control, memory, and register access via a 3, 4, or 5 bit scan based interface. Real-time data exchange capabilities can be accessed by scan or by using three higher bandwidth real-time data exchange formats that use direct target to emulator connections other than scan. The input and output triggers allow other system components to signal the chip with debug events and vice-versa. Bit I/O allows the emulator to stimulate or monitor system inputs and outputs. Bit I/O can be used to support factory test and other low bandwidth, non-time-critical emulator/target operations. Extended operating modes are used to specify device test and emulation operating modes. Emulator controller 130 is partitioned into communication and emulation sections. The communication section supports host communication links while the emulation section interfaces to the target, managing target debug functions and the device debug port. Emulation controller 130 communicates with host computer 120 using one of industry standard communication links outlined earlier herein. The host to emulator connection is established with off the shelf cabling technology. Host to emulator separation is governed by the standards applied to the interface used.

Emulation controller 130 communicates with the target system 140 through a target cable or cables. Debug, trace, triggers, and real-time data exchange capabilities share the target cable, and in some cases, the same device pins. More than one target cable may be required when the target system 140 deploys a trace width that cannot be accommodated in a single cable. All trace, real-time data exchange, and debug communication occurs over this link. Emulator controller 130 preferably allows for a target to emulator separation of at least two feet. This emulation technology is capable of test clock rates up to 50 MHZ and trace clock rates from 200 to 300 MHZ, or higher. Even though the emulator design uses techniques that should relax target system 140 constraints, signaling between emulator controller 130 and target system 140 at these rates requires design diligence. This emulation technology may impose restrictions on the placement of chip debug pins, board layout, and requires precise pin timings. On-chip pin macros are provided to assist in meeting timing constraints.

The on-chip debug facilities offer the developer a rich set of development capability in a two tiered, scalable approach. The first tier delivers functionality utilizing the real-time emulation capability built into a CPU's mega-modules. This real-time emulation capability has fixed functionality and is permanently part of the CPU while the high performance real-time data exchange, advanced analysis, and trace functions are added outside of the core in most cases. The capabilities are individually selected for addition to a chip. The addition of emulation peripherals to the system design creates the second tier functionality. A cost-effective library of emulation peripherals contains the building blocks to create systems and permits the construction of advanced analysis, high performance real-time data exchange, and trace capabilities. In the preferred embodiment five standard debug configurations are offered, although custom configurations are also supported. The specific configurations are covered later herein.

SUMMARY OF THE INVENTION

This invention is an emulation comparator that can operate as 2 individual comparators each of them comparing the processor memory access address (PMAA) and processor memory access data (PMAD) values issued by a processor against reference values stored in registers. Alternatively, it can operate as a single device that compares the memory access address against 2 sets of reference values forming a double bounded range. The data contents of the memory access may optionally be used as an extra qualifier to the address comparison.

The specific resources required for the implementation of the comparator can vary greatly depending on the requirements and constraints of a given implementation. In the example described in this application, the range comparator including 2 single reference address comparators and corresponding data comparator requires 13 user-visible registers in addition to the 2 address and 2 data compare logic functions.

Each of the 2 comparators can produce independent or dependent results based on selection made via the control register. The result of the 2 data comparators can be used as a qualifier to the associated address comparator or it can be ignored depending on the control register configuration.

The processor memory access addresses could be of multiple sizes depending on the processor architecture, such a as byte, half-word, word, double word. The comparator in the implementation described here can compare a reference against memory accesses of multiple sizes.

Aside from the data compare qualification the comparator can generate a match based on one of six address comparison criteria. The processor memory access address could be equal to the reference, not equal to the reference, greater than the reference, greater than or equal to the reference, less than the reference or less than or equal to the reference.

This invention enable full or partial overlap criteria. These are embodied in 2 modes when seeking an equality match. In the first mode, a match occurs only if the processor memory access overlaps all of the bytes in the reference. In the second mode, a match occurs if at least one byte of the processor memory access overlaps the reference.

The data comparator used in the example described in this application is an identity equality comparator. The data comparator produces a match only if all of the bits in the data that match the corresponding bits in the reference qualified by the overlap criteria are equal. The data comparator includes a reference mask value. For the case of the 64 bit memory data bus of this example, two 32-bit registers are required for each of the 2 data comparators. The mask allows the customization of the data bits that are required to match. Thus not necessarily requiring a match in all of the bits.

The comparator can be programmed via an interface to the memory map of the processor. This application calls this interface the configuration bus (cfgb).

The comparator capabilities can be exploited as a tool to be used by a hardware debug system that will take the comparator result as an input and will provide a wide range of responses depending on the configuration of the debug system.

BRIEF DESCRIPTION OF THE DRAWINGS

These and other aspects of this invention are illustrated in the drawings, in which.

DETAILED DESCRIPTION OF PREFERRED EMBODIMENTS

The ability to detect processor memory access to specific locations in memory is necessary to help processor code developers in troubleshooting software problems. The comparator of this invention is a powerful tool with several features and good flexibility that supports the software debugging effort. Other potential applications not related to debugging could include detection of processor memory access for triggering of system event interactions or changes in processor operation context.

The comparator of this invention provides the ability to detect the occurrence or absence of a processor memory access to an specific memory address or ranges of addresses that can be additionally qualified with the data involved in the processor memory access. Having the comparator integrated within a hardware debugging system enhances the capability of the system for detecting and resolving problems in the code being executed by the processor.

The comparator of this invention enhances the power and increases the flexibility in the detection of software problems when debugging process is based of detection of processor memory accesses. The capability of using full or partial overlap detection criteria in the comparator is specially important when the implementation is done for a processor architecture that can request accesses to memory locations at any byte boundary. Without this capability proper detection of processor memory access events in such an architecture will suffer of serious limitations and in many cases will not even be possible.

Figure 3:
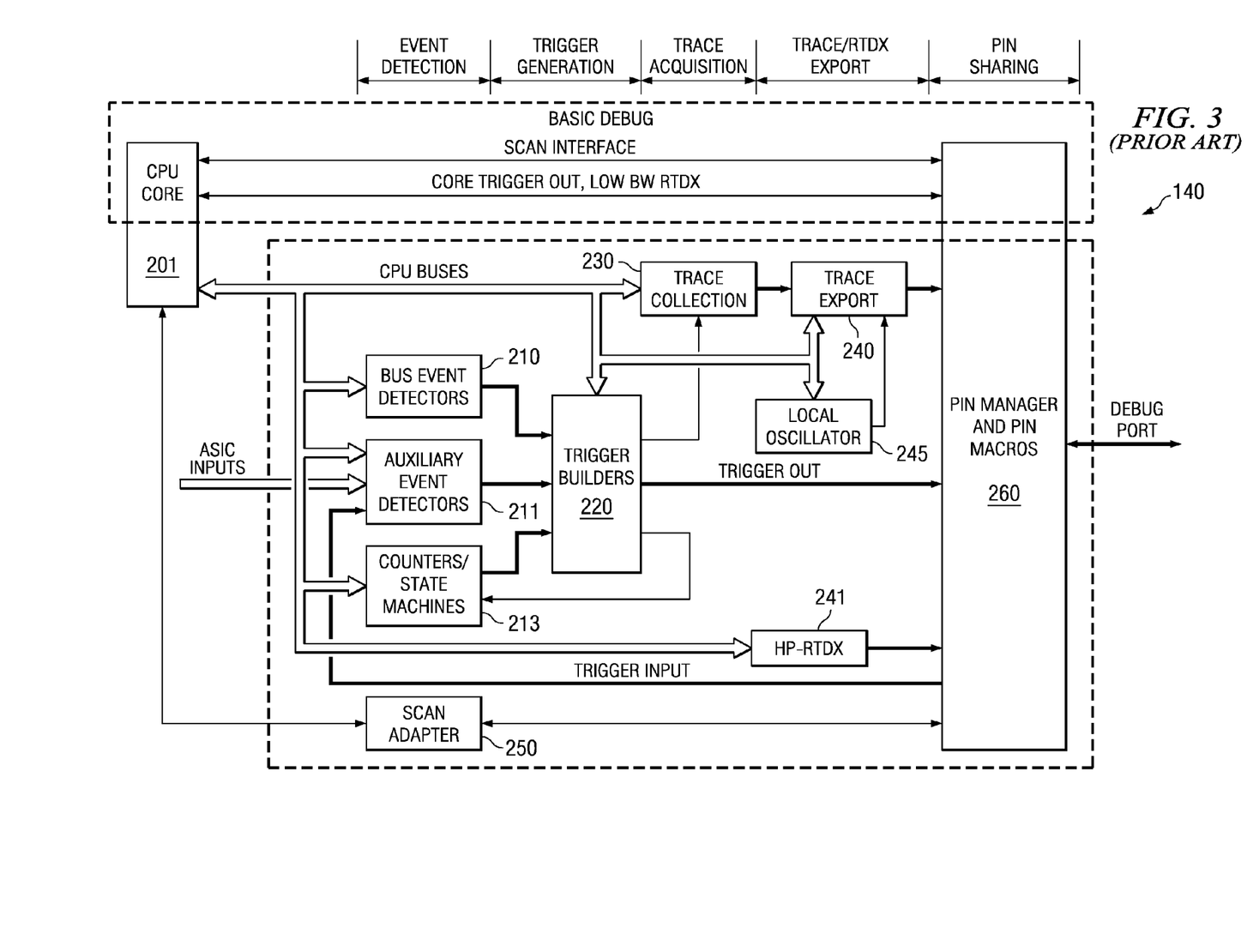
FIG. 3 illustrates in block diagram form a typical integrated circuit employing configurable emulation capability.

FIG. 3 illustrates an example of one on-chip debug architecture embodying target system 140. The architecture uses several module classes to create the debug function. One of these classes is event detectors including bus event detectors 210, auxiliary event detectors 211 and counters/state machines 213. A second class of modules is trigger generators including trigger builders 220. A third class of modules is data acquisition including trace collection 230 and formatting. A fourth class of modules is data export including trace export 240, and real-time data exchange export 241. Trace export 240 is controlled by clock signals from local oscillator 245. Local oscillator 245 will be described in detail below. A final class of modules is scan adaptor 250, which interfaces scan input/output to CPU core 201. Final data formatting and pin selection occurs in pin manager and pin micros 260.

The size of the debug function and its associated capabilities for any particular embodiment of a system-on-chip may be adjusted by either deleting complete functions or limiting the number of event detectors and trigger builders deployed. Additionally, the trace function can be incrementally increased from program counter trace only to program counter and data trace along with ASIC and CPU generated data. The real-time data exchange function may also be optionally deployed. The ability to customize on-chip tools changes the application development paradigm. Historically, all chip designs with a given CPU core were limited to a fixed set of debug capability. Now, an optimized debug capability is available for each chip design. This paradigm change gives system architects the tools needed to manage product development risk at an affordable cost. Note that the same CPU core may be used with differing peripherals with differing pin outs to embody differing system-on-chip products. These differing embodiments may require differing debug and emulation resources. The modularity of this invention permits each such embodiment to include only the necessary debug and emulation resources for the particular system-on-chip application.

The real-time emulation debug infrastructure component is used to tackle basic debug and instrumentation operations related to application development. It contains all execution control and register visibility capabilities and a minimal set of real-time data exchange and analysis such as breakpoint and watchpoint capabilities. These debug operations use on-chip hardware facilities to control the execution of the application and gain access to registers and memory. Some of the debug operations which may be supported by real-time emulation are: setting a software breakpoint and observing the machine state at that point; single step code advance to observe exact instruction by instruction decision making; detecting a spurious write to a known memory location; and viewing and changing memory and peripheral registers.

Real-time emulation facilities are incorporated into a CPU mega-module and are woven into the fabric of CPU core 201. This assures designs using CPU core 201 have sufficient debug facilities to support debugger application program 110 baseline debug, instrumentation, and data transfer capabilities. Each CPU core 201 incorporates a baseline set of emulation capabilities. These capabilities include but are not limited to: execution control such as run, single instruction step, halt and free run; displaying and modifying registers and memory; breakpoints including software and minimal hardware program breakpoints; and watchpoints including minimal hardware data breakpoints.

Figure 4:
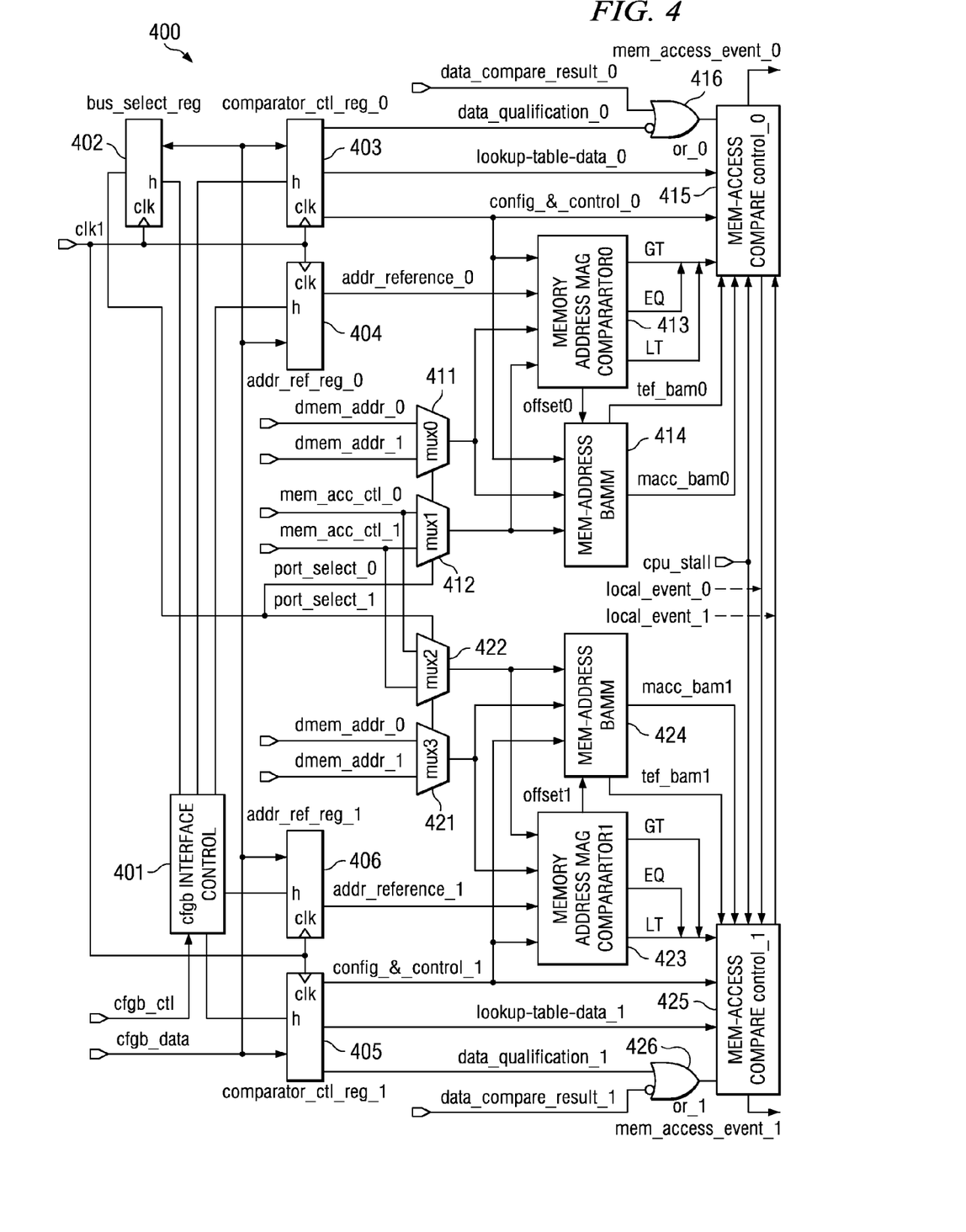
FIG. 4 illustrates in block diagram form two coupled memory access address comparators.

FIG. 4 illustrates comparator 400 including two individual address comparators that integrate the address component of the range comparator. Comparator 400 is preferably a part of bus event detectors 210. The flexible combination of comparator 400 enables detection of numerous types of bus events. The first comparator is at the top of FIG. 4 and the second comparator is at the bottom. Each address comparator has 4 main components: a processor memory access sampling mechanism (multiplexers 411, 412, 421 and 422); configuration resources (bus select register 402, comparator control registers 403 and 405, address reference registers 404 and 406); a program access address magnitude comparator (memory address magnitude comparators 413 and 423); and a memory access compare control block (415 and 425).

FIG. 4 illustrates four multiplexes 411, 412, 421 and 422 serving as the processor memory access sampling mechanism. FIG. 4 illustrates two program memory access address buses. Multiplexers 411 and 421 select the desired address bus signal from among the available data address buses dmem_addr_0 and dmem_addr_1. Multiplexers 412 and 422 select the corresponding control bus signals mem_acc_ctl_0 and mem_acc_ctl_1 associated with the selected data address bus. The user controls the bus selection to the 2 comparators by writing to the bus select register 402.

FIG. 4 illustrates 5 registers which are part of the comparator configuration. Bus select register 402, comparator control registers 403 and 405 and address reference registers 404 and 406 can be accessed like other configurable hardware resource in the processor via a memory interface called a configuration bus interface (cfgb). This memory interface includes configuration interface control 401 which receives a configuration control signal (cfgb_ctl). Configuration data (cfgb_data) and a configuration clock (cfgb_clk) are supplied to bus select register 402, comparator control registers 403 and 405 and address reference registers 404 and 406. Upon receipt of a register write request and the identity of the register via cfbg_ctl, configuration interface control 401 selects which register stores the data on the configuration data bus. The selected register stores the data on the configuration data bus upon the next configuration clock signal.

Data stored in bus select register 402 defines via multiplexers 411, 412, 421 and 422 which input bus is compared against the respective reference values. Multiplexer 411 selects either the first bus dmem_addr_0 or the second bus dmem_addr_1 for supply to memory address magnitude comparator 413 and memory address byte alignment map maker (BAMM) 414. Multiplexer 412 selects either the first control bus mem_acc_ctl_0 or the second control bus mem_acc_ctl_1 for supply to memory address magnitude comparator 413 and memory address byte alignment map maker 414. As described below, the ultimate match determination could depend upon the data size of the memory access indicated in the respective control bus signals. The selection of multiplexers 411 and 412 are controlled by bus select register 402 via port_select_0 signal. Address reference register 404 supplies a reference address to memory address magnitude comparator 413 and memory address byte alignment map maker 414 for the comparison. Multiplexers 421 and 422 similarly select the address and corresponding control bus for memory address magnitude comparator 423 and memory address byte alignment map maker 424 under control of bus select register 402 via port_select_1 signal. Address reference register 406 stores the reference address for memory address magnitude comparator 423 and memory address byte alignment map maker 424.

Memory address magnitude comparators 413 and 423 perform the actual comparison between the reference value and the selected processor memory access address. Memory address magnitude comparators 413 and 423 each generate an equal signal (EQ) if the processor memory access address equals the reference address, a greater than signal (GT) if the processor memory access address is greater than the reference address or a less than signal (LT) if the processor memory access address is less than the reference address. Memory address magnitude comparators 413 and 423 also generate respective offset signals offset_0 and offset_1. These offset signals are supplied to the corresponding memory address byte alignment map maker 414 or 424. Memory address magnitude comparator 413 and memory address byte alignment map maker 414 receive a configuration and control signal config_&_control_0 from comparator control register 403. Memory address magnitude comparator 423 and memory address byte alignment map maker 424 receive a similar configuration and control signal config_&_control_1 from comparator control register 405.

Offset signals offset_0 and offset_1 describe the offset in bytes between the processor memory access address and the reference address. Respective memory address byte alignment map makers 414 and 424 generate two signals. The first is called the reference byte alignment map (ref_bam). The second is called the memory access byte alignment map (macc_bam). These signals are fundamental to providing detection of full or partial overlap between the reference address and the program memory access address.

Outputs GT, LT, EQ from the memory address magnitude comparators 413 and 423 and the reference byte alignment map (ref_bam) and memory access byte alignment map (macc_bam) from the memory address byte alignment map makers 414 and 424 are supplied to respective memory access compare control blocks 415 and 425. The memory access byte alignment map signal and the memory access byte alignment map from the memory address byte alignment memory makers 414 and 424 are supplied to respective memory access compare control blocks 415 and 425. Memory access compare control blocks 415 and 425 generate corresponding mem_access_event outputs depending on these input signals, the data comparator qualification from respective OR gates 416 and 426 and the configuration information defined in comparator control registers 403 and 405. Memory access magnitude comparators 415 and 425 take the 3 result signals (GT, LT, EQ) from corresponding memory address magnitude comparators 414 and 424 and expand them into six comparison mode selections. These are: greater than; less than; equal to; not equal to; less than or equal to; and greater than or equal to. At the same time the byte alignment map signals ref_bam and macc_bam are compared based on the configuration signal from the corresponding comparison control register 403 or 405 to produce the overlap match result. Each of the two comparators can be programmed in one of the 6 comparison modes and using the detection criteria of that mode with the overlap match result it generates a partial comparator detection event. Memory access comparison control block 415 supplies local_event_0 signal to memory access comparison control block 425. Memory access comparison control block 425 supplies local_event_1 signal to memory access comparison control block 415.

Each memory access comparison control block 415 and 425 receives 4 entry lookup table from the corresponding comparator control register 403 and 405 via respective signals look_up_table_0 and look_up_table_1. The table look up signals enable the final outputs mem_access_event_0 and mem_access_event_1 to depend upon the local_event signal from the other memory access comparison control block. This dependency enables address range comparisons with each comparator testing one for the limit values. Either or both memory access comparison control blocks 415 and 425 may be disabled when the central processing unit stall signal (cpu_stall) is active depending upon the configuration data stored in respective comparator control registers 403 and 405.

There are several possibilities where a user would be interested in a memory access not exactly equal to the reference address. Depending upon the respective data size of the reference address and the bus address, a bus access having a different address may touch the reference address. For example, a word or half word write may overwrite a byte of data without having the exact address of the data byte. Typically the user is merely interested in whether the tracked memory access touches the reference and not interested in the exact data size and bus address combination. The rule for determining whether a compare operation is successful can be simply stated as "If any of the bytes of interest are touched, then the compare is successful." Such a match depends upon on both the address bus value and the data size.

The reference address is viewed a series of bytes aligned to a 32-bit address boundary and populated based on the byte address of the reference address and the size associated with the reference address. The size associated with the reference address can be 1 byte (byte), 2 bytes (half-word), or 4 bytes (full-word). The bus address is represented in the same fashion. A comparator match is declared when any of the following conditions evaluate true. A bus address referencing any byte of the reference address causes an equals match when the equals comparison is enabled. A bus address referencing any byte with a higher address than the highest byte specified by the reference address causes a greater than match when the greater than comparison is specified. A bus address referencing any byte with a lower address than the lowest byte specified by the reference address creates a less than match when the less than comparison is specified. Note that all three conditions can create a match simultaneously. For example, a full word memory access overlapping a reference address specified as a byte creates this condition. This allows any size access touching above, below, or on a specified set of bytes can be declared a match.

Table 1 shows the five cases for a non-aligned bus comparison for a memory system supporting full-word, half-word and byte accesses beginning at any byte addressable boundary. The three cases in the center of Table 1 are conditional upon the size of the reference address and bus address. The other two cases allow a complete comparison without address size information.

TABLE 1

| 32-bit Addresses | | | | |
|---|---|---|---|---|
| Reference Address+1 | Reference Address+1 | Reference Address | Reference Address−1 | Reference Address−1 |
| Bus Add> | | | | |
| | Bus Add= | | | |
| | | Bus Add= | | |
| | | | Bus Add= | |
| | | | | Bus Add< |

Accesses are divided into a series of 7 byte enables created from bus address[1:0] and size[1:0] data. These 7 bytes enables allow the specification of a full word access starting at any of the byte addresses associated with a 32-bit word define the position of the bytes affected by the access. Note that the emulation software should ensure that the memory access size is greater than or equal to the reference size. Memory access compare control blocks 415 and 425 receive the GT, LT, EQ outputs from respective memory address magnitude comparators 413 and 423 and the reference byte alignment map (ref_bam) and memory access byte alignment map (macc_bam) from respective memory address byte alignment map makers 414 and 424 and then form the requested address comparison based upon the respective bus and reference data sizes.

Table X shows an example coding for the qualification signals config_&_control_0 and look_up_table_0 stored in comparator control register 403. Config_&_control_1 and look_up_table 1 stored in comparator control register 413 are similarly coded.

TABLE 2

| Bit(s) | Name |
|---|---|
| 11 | EXACT |
| 10:9 | REF |
| 8 | EXE |
| 7 | STALL |
| 6 | ETYPE |
| 5 | Reserved |
| 4 | R/W |
| 3:0 | ACCESS |

The EXACT bit (bit 11) defines the exactness of the address comparison. If EXACT=0, then a match occurs for any byte touching the reference address. If EXACT=1, then a match occurs only for an exact address match.

The REF bits (bits 10 and 9) define the size of the address and data reference values. This is shown in Table X+1.

TABLE 3

| REF[10:9] | Reference Size |
|---|---|
| 00 | Byte |
| 01 | Half Word |
| 10 | Word |
| 11 | Double Word |

The EXE bit (bit 8) determines qualification program counter events. If EXE=1, the qualification of all program counter bus events with the execution of a single instruction from the despatch unit is permitted. If EXE=0, then qualification of program counter bus events with single instruction dispatches is masked. This masking permits a simple function range based only on addresses (as long as we have STALL set). This is useful only for program counter address ranges.

The STALL bit (bit 7) controls whether stalls can qualify as bus events. If STALL=1, then qualification of bus events with active pipeline cycles is masked. This permits a block range event as a level as long as the EXE bit is 0. This is useful only for program counter address ranges. If STALL=0, then stalls in the data access and program counter access are permitted to qualify bus events.

The ETYPE bit (bit 6) controls detection of emulation memory accesses. When ETYPE=0, emulation access cycles are not detected.

The R/W bit (bit 4) determines whether the match is made for a read operation or a write operation. If R/W=1, then the comparator detects on a read operation. If R/W=0, then the comparator detects on a write operation.

The QLU field (bits 3:0) defines the bus event qualification necessary for data size. Table X+2 shows the coding of these bits.

TABLE 4

| Bits [3:0] | Access Size Detected |
|---|---|
| 0000 | No accesses |
| 0001 | Byte |
| 0010 | Half Word |
| 0011 | Half Word and Byte |
| 0100 | Word |
| 0101 | Word and Byte |
| 0110 | Word and Half Word |
| 0111 | Word, Half Word and Byte |
| 1000 | Double Word |
| 1001 | Double Word and Byte |
| 1010 | Double Word and Half Word |
| 1011 | Double Word, Half Word and Byte |
| 1100 | Double Word and Word |
| 1101 | Double Word, Word and Byte |
| 1110 | Double Word, Word and Half Word |
| 1111 | Double Word, Word, Half Word and Byte |

These bits determine which access size or sizes are of interest to the bus detection hardware. The lookup table maps a set of bits to the access size(s) detected.

Figure 5:
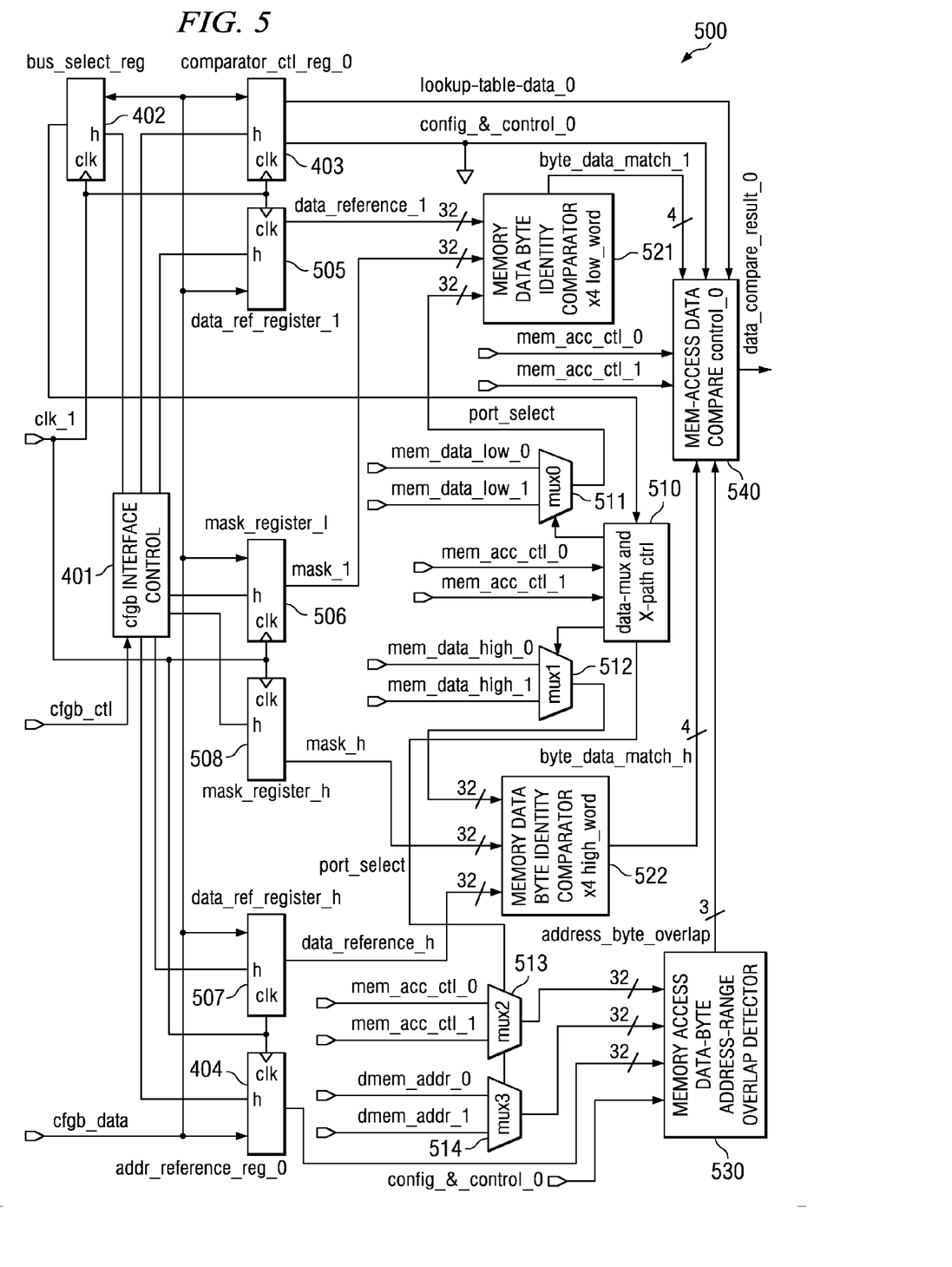
FIG. 5 illustrates in block diagram form an example data comparator.

FIG. 5 illustrates a companion data comparator. The preferred embodiment uses two data comparators 500, one supplying each memory access comparison control block 415 and 425 via respective OR gates 416 and 426. In many implementations it is acceptable to use a only single data comparator 500 shared by both address comparators. This would cost some reduction in flexibility.

The preferred embodiment of data comparator 500 operates on a 64-bit data bus and thus requires twice as many resources in the data path that what will be required for a 32-bit data bus implementation. Data comparator 500 includes six sections of logic: configuration resources (401, 402, 403, 404, 505, 506 and 507); sampling logic (510, 511, 512, 513, 514); memory data identity comparators (521 and 522); a memory access data-byte address-range overlap detector (530); and a memory access data compare control (540).

The configuration resources includes configuration interface control 401 and seven registers. Bus select register 402 and interface control 401 are shared with the address comparator 400 illustrated in FIG. 4. Comparator control register 403 and address reference register 404 are shared with the corresponding address comparison function. Sixty four bits of comparison data are stored as two 32-bit words. Data reference register low (data_reference_reg_1) 505 stores the 32 least significant bits and data reference register high (data_reference_reg_h) 507 stores the 32 most significant bits. Sixty four bits of mask data are stored as two 32-bit words. Mask register low (mask_reg_1) 506 stores the 32 least significant bits and mask register high (mask_reg_h) 508 stores the 32 most significant bits. Bit locations in mask resisters 506 and 508 set to 0 are assumed match and those set to 1 are compared. These registers can be accessed like other configurable hardware resource in the processor via a configuration bus and configuration interface control 401.

The sampling logic defines the selection of the data bus and associated control and address information related to the memory access. Multiplexer 511 selects either 32 least significant bit data bus mem_data_low_0 or mem_data_low_0 for supply to memory data byte identity comparator low 521. Multiplexer 512 selects either 32 most significant bit data bus mem_data_high_0 or mem_data_high_0 for supply to memory data byte identity comparator low 522. The selections are controlled by data multiplexer and path control logic 510 responsive to the port_select signal from bus select register 402 and to the memory access control signals mem_acc_ctl_0 and mem_acc_ctl_1, which correspond to respective data buses. The user controls the bus selection to use for the comparison by writing to the bus select register 402.

Memory data byte identity comparator low 521 receives 32 least significant bits of reference data from data reference low register 505, 32 least significant bits of mask data from mask register low 506 and the selected 32 least significant bits of memory data from multiplexer 511. Memory data byte identity comparator high 522 similarly receives 32 most significant bits of reference data from data reference high register 507, 32 least significant bits of mask data from mask register high 508 and the selected 32 most significant bits of memory data from multiplexer 512. Memory data byte identity comparators 521 and 522 generate corresponding match signals byte_data_match_0 and byte_data_match_1. Memory data byte identity comparators 521 and 522 each use the corresponding mask to do identity comparison on each individual byte of the data bus. Each bus match signal separately indicates a match for the corresponding four bytes. This enables operation on multiple sizes concurrently. Assuming the smallest data size is a byte and all other sizes are a byte multiple, then data comparator can provide a match indication for any one of 4 data sizes: byte (8 bits); half-word (16 bits); word (32 bits); and double-word (64 bits).

Memory access data byte address range overlap detector 530 generates information about the relative overlap between the bytes of the memory-access and the bytes of the reference, address_byte_overlap. Multiplexer 513 selects one memory access control signal mem_acc_ctl_0 or mem_acc_ctl_1 under control of the port_select signal from data multiplexer and path control logic 510. Multiplexer 514 similarly selects one of the address buses dmem_addr_0 and dmem_addr_1 under control of the port select signal. Memory access data byte address range overlap detector 530 receives the selected memory bus control signals from multiplexer 513, the selected address bus signal from multiplexer 514, the address from address reference register 404 and a configuration and control signal from comparator control register 403. Memory access data byte address range overlap detector 530 produces eight overlap signals (address_byte_overlap) calculated similarly to overlap calculation used in address comparator 400 to generate the byte alignment map.

Memory access data compare control 540 generates the data_compare_result_0. Memory access data compare control 540 receives: eight partial data comparison results, four are byte_data_match_1 from memory data byte identity comparator 521 and four are byte_data_match_h from memory data byte identity comparator 522; the eight address_byte_overlap signals from memory access data byte address range overlap detector 530; control bus information from the memory access (mem_acc_ctl_0 and mem_acc_ctl_1); and the look up table data from comparator control register 403. Memory access data compare control 540 uses these signals to generate the data match signal (data_compare_result_0). As described above in, this data match signal can used to qualify the address comparison.

Table 2 illustrates the manner of duplication of values for a reference data size less than a double-word.

TABLE 5

| Ref Size | B7 | B6 | B5 | B4 | B3 | B2 | B1 | B0 |
|---|---|---|---|---|---|---|---|---|
| Byte | Value | Value | Value | Value | Value | Value | Value | Value |
| Half Word | | Value | | Value | | Value | | Value |
| Word | | | | Value | | | | Value |
| Dbl word | | | | | Value | | | |

The columns B0 to B7 correspond to the eight bytes in data reference register low 505 and data reference register high 507. Low bytes B0 to B3 are stored in data reference register low 505 and high bytes B4 to B7 are stored in data reference register high 507. Duplication of data in this fashion together with appropriate byte strobes will permit any desired match for any combination of memory access size and reference size. Only the data bytes references by an access are included in the data comparison.

The preferred embodiment of this invention includes two data comparators 500. The first is as illustrated in FIG. 5. The second address comparator is similar except that comparator control register 403 is replaced with comparator control register 405, address reference register 404 is replaced with address reference register 406 and the compare output data_compare_result_1 is supplied to OR gate 426 rather than OR gate 416. As a further alternative, two data comparators as shown in FIG. 5 may be employed together to perform a data range comparison. One data comparator would detect the lower boundary of the data range and the second data comparator would detect the upper boundary of the data range. The result of this data range comparison may be supplied via the data comparator qualification signals to a selected one of or to both of data compare qualification OR gates 416 and 426.

What is claimed is:

1. A memory access address comparator apparatus, comprising:
   a first comparator receiving a first reference address and a first address used by a data processor to access memory, said first comparator generating a selected one of a first greater than output, a first less than output and a first equal to output depending upon a relationship between said first address and said first reference address, and said first comparator generating a first offset signal indicative of an offset between said first address and said first reference address;
   a second comparator receiving a second reference address and a second address used by a data processor to access memory, said second comparator generating a selected one of a second greater than output, a second less than output and a second equal to output depending upon a relationship between said second address and said second reference address, and said second comparator generating a second offset signal indicative of an offset between said second address and said second reference address;
   a first compare control unit coupled to said first comparator, said first compare control unit generating a first local event signal based on one of said first offset signal, said first greater than output, said first less than output and said first equal to output; and
   a second compare control unit coupled to said second comparator and said first compare control unit, said second compare control unit generating a second local event signal based on one of said second offset signal, said second greater than output, said second less than output and said second equal to output, wherein said first compare control unit generates a first memory access event signal based on one of said first offset signal and said second local event signal, and said second compare control unit generates a second memory access event signal based on one of said second offset signal and said first local event signal.

2. The apparatus of claim 1, wherein said first compare control unit includes an input for receiving first information indicative of a first comparison between first reference data and first data stored at said first address, and wherein said first compare control unit generates said first memory access event signal based on said first information.

3. The apparatus of claim 2, wherein said second compare control unit includes an input for receiving second information indicative of a second comparison between second reference data and second data stored at said second address, and wherein said second compare control unit generates said second memory access event signal based on said second information.

4. The apparatus of claim 3, including a data comparator coupled to said first and second compare control units, said data comparator performing said first and second comparisons and producing said first information and said second information.

5. The apparatus of claim 4, wherein said data comparator includes mask logic for limiting said first and second comparisons to portions of said first data, said first reference data, said second data, and said second reference data specified by mask information.

6. The apparatus of claim 2, including a data comparator coupled to said first compare control unit, said data comparator performing said first comparison and producing said first information.

7. The apparatus of claim 6, wherein said data comparator includes mask logic for limiting said first comparison to portions of said first data and said first reference data specified by mask information.

8. The apparatus of claim 1, including first and second programmable registers respectively coupled to said first and second comparators for storing said first and second reference addresses.

9. A memory access address comparison method, comprising:
   generating a selected one of a first greater than indication, a first less than indication and a first equal to indication depending upon a relationship between a first reference address and a first address used by a data processor to access memory;
   generating a first offset signal indicative of an offset between said first address and said first reference address;
   generating a first event signal based on one of said first offset signal, said first greater than indication, said first less than indication and said first equal to indication;
   generating a selected one of a second greater than indication, a second less than indication and a second equal to indication depending upon a relationship between a second reference address and a second address used by a data processor to access memory;
   generating a second offset signal indicative of an offset between said second address and said second reference address;
   generating a second event signal based on one of said second offset signal, said second greater than indication, said second less than indication and said second equal to indication;
   generating a first memory access event signal based on one of said first offset signal and said second event signal; and
   generating a second memory access event signal based on one of said second offset signal and said first event signal.

10. The method of claim 9, including generating said first memory access event signal based on first information indicative of a first comparison between first reference data and first data stored at said first address.

11. The method of claim 10, including generating said second memory access event signal based on second information indicative of a second comparison between second reference data and second data stored at said second address.

12. The method of claim 11, including performing said first and second comparisons.

13. The method of claim 12, including limiting said first and second comparisons to portions of said first data, said first reference data, said second data, and said second reference data specified by mask information.

14. The method of claim 10, including performing said first comparison.

15. The method of claim 14, including limiting said first comparison to portions of said first data and said first reference data specified by mask information.

16. An integrated circuit apparatus, comprising:
   a data processor; and
   a memory access address comparator coupled to said data processor to receive therefrom first and second addresses used by said data processor to access memory, said memory access address comparator including
   a first comparator receiving said first address and a first reference address, and generating a selected one of a first greater than output, a first less than output and a first equal to output depending upon a relationship between said first address and said first reference address, and said first comparator generating a first offset signal indicative of an offset between said first address and said first reference address, a second comparator receiving said second address and a second reference address, and generating a selected one of a second greater than output, a second less than output and a second equal to output depending upon a relationship between said second address and said second reference address, and said second comparator generating a second offset signal indicative of an offset between said second address and said second reference address, a first compare control unit coupled to said first comparator, said first compare control unit generating a first local event signal based on one of said first offset signal, said first greater than output, said first less than output and said first equal to output, and a second compare control unit coupled to said second comparator and said first compare control unit, said second compare control unit generating a second local event signal based on one of said second offset signal, said second greater than output, said second less than output and said second equal to output, wherein said first compare control unit generates a first memory access event signal based on one of said first offset signal and said second local event signal, and said second compare control unit generates a second memory access event signal based on one of said second offset signal and said first local event signal.

17. The apparatus of claim 16, wherein said first compare control unit includes an input for receiving first information indicative of a first comparison between first reference data and first data stored at said first address, and wherein said first compare control unit generates said first memory access event signal based on said first information.

18. The apparatus of claim 17, wherein said second compare control unit includes an input for receiving second information indicative of a second comparison between second reference data and second data stored at said second address, and wherein said second compare control unit generates said second memory access event signal based on said second information.

19. The apparatus of claim 18, including a data comparator coupled to said first and second compare control units, said data comparator performing said first and second comparisons and producing said first information and said second information.

20. The apparatus of claim 19, wherein said data comparator includes mask logic for limiting said first and second comparisons to portions of said first data, said first reference data, said second data, and said second reference data specified by mask information.

* * * * *